US006798298B2

(12) United States Patent
Davis et al.

(10) Patent No.: US 6,798,298 B2
(45) Date of Patent: Sep. 28, 2004

(54) BALANCING CIRCUIT, METHOD OF OPERATION THEREOF AND A CHARGE PUMP EMPLOYING THE SAME

(75) Inventors: Paul C. Davis, Reading, PA (US); Irving G. Post, Reading, PA (US)

(73) Assignee: Agere Systems Inc., Allentown, PA (US)

(*) Notice: Subject to any disclaimer, the term of this patent is extended or adjusted under 35 U.S.C. 154(b) by 191 days.

(21) Appl. No.: 09/993,588

(22) Filed: Nov. 16, 2001

(65) Prior Publication Data

US 2003/0095001 A1 May 22, 2003

(51) Int. Cl.[7] .................................................. H03L 7/00
(52) U.S. Cl. ........................... 331/16; 331/25; 327/264; 327/285; 327/413
(58) Field of Search ........................... 331/16, 25, 175; 327/264, 285, 413, 536

(56) References Cited

U.S. PATENT DOCUMENTS 5,508,660 A * 4/1996 Gersbach et al. ............. 331/17

OTHER PUBLICATIONS

"A 2.7V to 4.5V Single–Chip GSM Transceiver RF Integrated Circuit" by Trudy Stetzler; Irving Post, Joseph Havens, Mikio Koyama; 1995 IEEE ISSCC Digest of technical Papers; pp. 150, 151.

"A 2.7V 2.5GHz Bipolar Chipset for Digital Wireless Communication" by Stefan Heinen, Karim Hadjizada, Udo Matter, Werner Geppert, Volker Thomas, Stephan Weber, Stefan Beyer, Josef Fenk and Ernst Matschke; 1997 IEEE ISSCC Digeest of Technical Papers; pp. 306,307.

* cited by examiner

*Primary Examiner*—Arnold Kinkead

(57) ABSTRACT

A balancing circuit and method of operation thereof for use with a circuit having first and second complementary drivers exhibiting different current gain characteristics. In one embodiment, the balancing circuit includes a sensing subcircuit that provides a correction signal indicating a first current gain characteristic of the first driver. The balancing circuit also includes a compensation subcircuit that generates a current gain compensation signal to the first driver to substantially match a second current gain characteristic of the second driver based on the correction signal.

24 Claims, 2 Drawing Sheets

BALANCING CIRCUIT, METHOD OF OPERATION THEREOF AND A CHARGE PUMP EMPLOYING THE SAME

TECHNICAL FIELD OF THE INVENTION

The present invention is directed, in general, to electronic devices and, more specifically, to a balancing circuit, method of operation thereof and a charge pump employing the circuit and method.

BACKGROUND OF THE INVENTION

Phase locked loop (PLL) architectures are electronic circuits that control an oscillator to maintain a constant phase angle relative to a reference signal, such as a master clock signal. They are widely used in many digital applications, such as computer and communications systems, wherein derivative clock signals typically must be synchronized within the system. They may be used to accomplish functions such as coherent carrier tracking and threshold extension, bit synchronization and symbol synchronization.

PLL architectures typically employ a voltage controlled oscillator whose output frequency is proportional to an input voltage. This input voltage is often supplied by a capacitor wherein its voltage is increased or decreased by an incremental change to its charge. The capacitor provides a degree of filtering since its charge, and therefore its voltage, changes at a predetermined rate. A charge pump is used to provide a constant current of the required polarity to the capacitor. The charge pump receives a digital signal input from a feedback comparator circuit, which compares the phase of the output frequency to a reference input frequency. The comparator circuit directs an appropriate change to the charge pump to maintain a required phase of the output frequency to the reference frequency.

The digital signal input to the charge pump directs the polarity of its charge to the capacitor. To maintain a desired linearity of the output frequency, the values of the positive and negative charges supplied by the charge pump need to be within an appropriate tolerance of one another. Complimentary output drivers are typically employed to deliver the charging current from the charge pump. This dictates that the gain characteristics of the complementary output drivers should be within the appropriate tolerance of one another.

Large-area, complementary metal-oxide semiconductor (CMOS) devices are currently used as complementary output drivers in charge pump applications. These output devices are often biased in normal operation either at or above a rated breakdown voltage to provide an increased output voltage capability. When attempting to use a charge pump employing CMOS devices at supply voltages greater than rated voltage, reliability issues surface and problems begin to occur. In addition to gate oxide breakdown possibilities, the transistors may exhibit "hot carrier" degradation of the threshold voltage under long term use. To avoid the latter problem, the devices may be fabricated with channel lengths that are eight to ten times a minimum channel width.

To exhibit a low conduction voltage characteristic, these transistors must also be designed with very wide gates to maintain a large enough width-to-length ratio. The resulting very large transistors exhibit a large parasitic capacitance, which must be charged during a turn-on of the device. These resulting large capacitor current pulses may be as much as ten times larger than the output currents, thereby creating noise on a substrate including the device similar to digital interference. This situation degrades the operation of radio frequency circuits on the same substrates. CMOS charge pumps, so constructed, exhibit difficulty meeting necessary pulse shape, matching and leakage requirements.

The use of complementary bipolar transistors as the complementary output drivers also exhibits several difficulties. The bias currents necessary to generate high speed output pulses using lateral bipolar transistors may be five to eight times greater than the required output current, thereby creating a substantial bias current drain. Vertical bipolar transistors allow acceptable switching speeds at higher supply voltages without the need for large bias currents thereby greatly reducing substrate noise and extensive bias current requirements. However, currently employable lateral and vertical bipolar transistors exhibit current gains that are very different between NPN and PNP polarities, sometimes by a ten-to-one margin. This condition currently discourages their use when appropriate positive and negative output current tolerance requirements are within a few percent of one another.

Accordingly, what is needed in the art is a circuit and method that facilitates the operation of complementary drivers that overcomes the deficiencies of the prior art.

SUMMARY OF THE INVENTION

To address the above-discussed deficiencies of the prior art, the present invention provides a balancing circuit and method of operation thereof for use with a circuit having first and second complementary drivers exhibiting different current gain characteristics. In one embodiment, the balancing circuit includes a sensing subcircuit that provides a correction signal indicating a first current gain characteristic of the first driver. The balancing circuit also includes a compensation subcircuit that generates a current gain compensation signal to the first driver to substantially match a second current gain characteristic of the second driver based on the correction signal.

In another aspect, the present invention provides a phase locked loop (PLL) circuit including a voltage controlled oscillator, coupled to a filter circuit, that receives a signal associated with a charging signal and provides an output signal having an output frequency. The PLL circuit also includes a comparator circuit that provides a comparison signal proportional to a phase difference between the output signal having the output frequency and an input reference signal having an input frequency. The PLL circuit still further includes a charge pump that provides the charging signal via first and second complementary drivers exhibiting different current gain characteristics. The charge pump has a balancing circuit including a sensing subcircuit that provides a correction signal indicating a first current gain characteristic of the first driver. The balancing circuit also includes a compensation subcircuit that generates a current gain compensation signal to the first driver to substantially match a second current gain characteristic of the second driver based on the correction signal.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
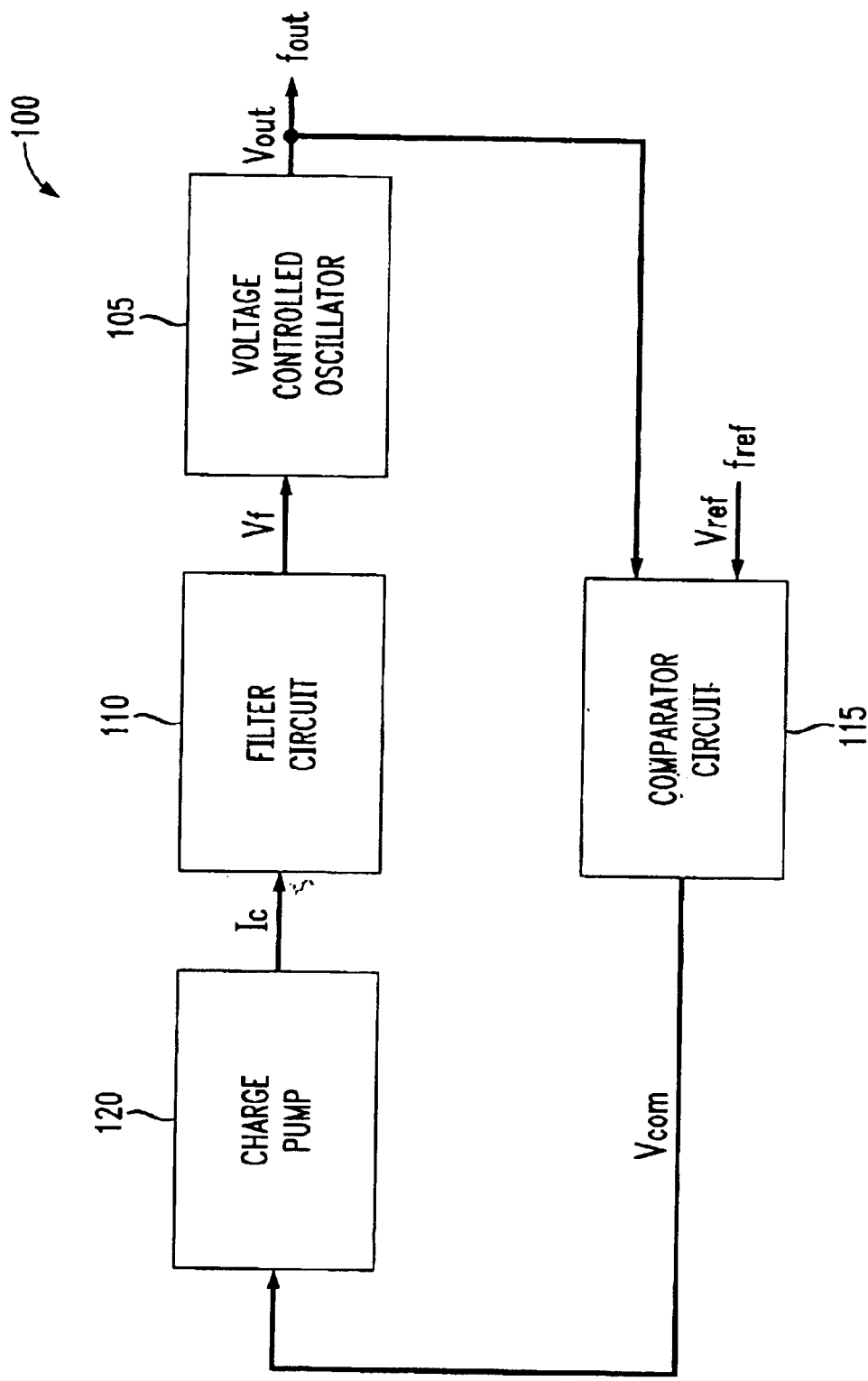
FIG. 1 illustrates a block diagram of an embodiment of a phased locked loop (PLL) circuit, constructed in accordance with the principles of the present invention.

Referring initially to FIG. 1, illustrated is a block diagram of an embodiment of a phased locked loop (PLL) circuit, generally designated 100, constructed in accordance with the principles of the present invention. The PLL circuit 100 includes a voltage controlled oscillator 105, a filter circuit 110, a comparator circuit 115 and a charge pump 120.

The voltage controlled oscillator 105 provides an oscillator output voltage Vout having a PLL output frequency fout and receives a filter output voltage Vf from the filter circuit 110. The voltage controlled oscillator 105 provides the PLL output frequency fout as a function of the filter output voltage Vf. In this embodiment, the PLL output frequency fout varies directly with the filter output voltage Vf. The filter circuit 110 employs a capacitor wherein a capacitor charge is either added or subtracted to generate a value of the filter output voltage Vf. The capacitor charge is determined by the polarity of a charging signal current Ic that is received from the charge pump 120.

The comparator circuit 115 provides a comparison signal voltage Vcom that is proportional to a phase difference between the PLL output frequency fout and an input reference frequency fref associated with an input reference signal voltage Vref. The comparison signal voltage Vcom is generally a digital signal, which determines the polarity and duration of the charging signal current Ic provided by the charge pump 120. In the illustrated embodiment, the charging signal current Ic is provided via first and second complementary drivers within the charge pump 120 that employ PNP and NPN transistors having significantly different current gain characteristics. To maintain overall linearity of the charging signal current Ic, the present invention includes a balancing circuit within the charge pump 120.

The balancing circuit has a sensing subcircuit and a compensation subcircuit. The sensing subcircuit provides a correction signal that indicates a first current gain characteristic of the first driver, which in the present embodiment is significantly smaller than a second current gain characteristic of the second driver. The compensation subcircuit generates a current gain compensation signal to the first driver to substantially match the second current gain characteristic of the second driver, based on the correction signal. The ratio of the first and second current gain characteristics includes the ratio of the collector-to-base currents of the devices associated with the first and second drivers, in the current embodiment. Of course, other current gain characteristics may be employed in alternative embodiments. An advantageous embodiment of a balancing circuit is further discussed with respect to FIG. 2 below.

Figure 2:
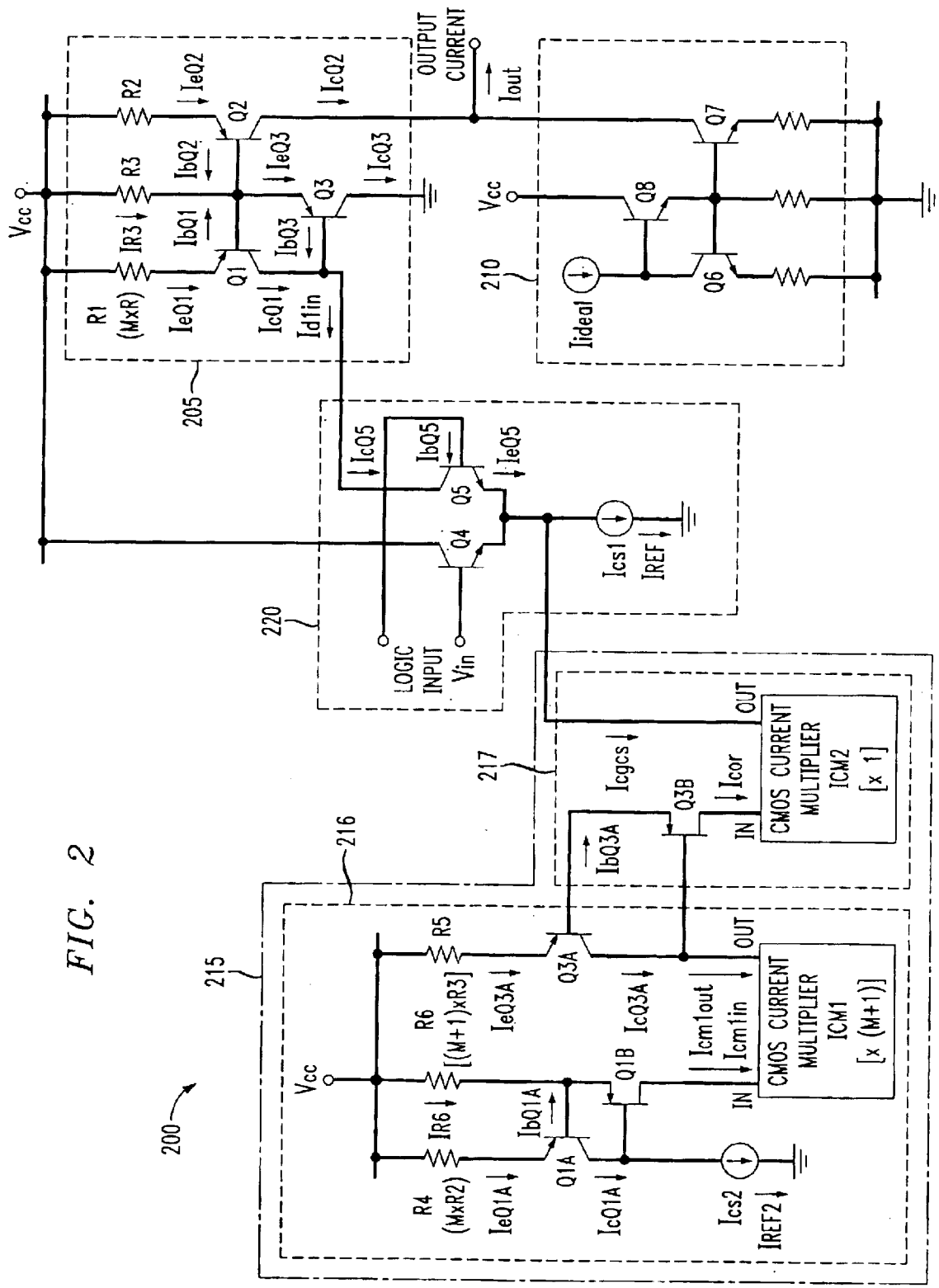
FIG. 2 illustrates a circuit diagram of an embodiment of a complementary driver circuit, constructed according to the principles of the present invention.

Turning now to FIG. 2, illustrated is a circuit diagram of an embodiment of a complementary driver circuit, generally designated 200, constructed in accordance with the principles of the present invention. The complementary driver circuit 200, having a logic input voltage Vin and an output current Iout, includes first and second drivers 205, 210 that are complementary in nature, a balancing circuit 215 and a logic switching circuit 220. The balancing circuit 215 includes a sensing subcircuit 216 and a compensation subcircuit 217.

The first driver 205 employs vertical PNP transistors having a collector-to-base current gain (herein referred to as PNPbeta) that is typically about 10. In contrast, the second driver 210 employs vertical NPN transistors having a collector-to-base current gain (herein referred to as NPNbeta) that is typically about 100. This large difference between the PNPbeta and the NPNbeta would typically present an unacceptably large difference in the output current Iout if the same input drive signal were used to drive both the first and second drivers 205, 210. The balancing circuit 215 is employed to maintain the output current Iout to within an acceptably close value (e.g., within about 5 percent in the illustrated embodiment) for both the first and second drivers 205, 210.

The first driver 205 operates as a switched source of current that provides the output current Iout to an output of the complementary driver circuit 200 when it is in an activated or conducting state. The first driver 205 includes first, second and third PNP transistors Q1, Q2, Q3 and first, second and third resistors R1, R2, R3. The first and second PNP transistors are similar in nature and selected such that their respective values of emitter-base voltage and PNPbeta are reasonably well matched. The third PNP transistor Q3 functions as a "helper" and provides the base currents for the first and second PNP transistors Q1, Q2. Additionally, a reference current Iref may be defined as the output current Iout divided by a gain factor M, which is typically an integer. The gain factor M may be generally chosen to conserve power without inappropriately sacrificing switching speeds.

As an example of the illustrated embodiment, values of an output current Iout of 2000 microamperes, a gain factor M of 10 and a PNPbeta of 10 may be selected for purposes of discussion. For the second PNP transistor Q2, these selections provide a second PNP transistor Q2 collector current IcQ2 of 2000 microamperes (equal to the output current Iout), a second PNP transistor Q2 base current IbQ2 of 200 microamperes and a second PNP transistor Q2 emitter current IeQ2 of 2200 microamperes. The first resistor R1 has a value that is ten times the value of the second resistor R2 (M×R2). This establishes an emitter current IeQ1 of 220 microamperes, a collector current IcQ1 of 200 microamperes and a base current IbQ1 of 20 microamperes for the first PNP transistor Q1. In this example, a resistor current IR3 of 220 microamperes may be chosen for the third resistor R3. An emitter current IeQ3 of 440 microamperes, a base current IbQ3 of 40 microamperes and a collector current IcQ3 of 400 microamperes are then established for the third PNP transistor Q3.

The logic switching circuit 220 determines when the first driver 205 is conducting by accepting a first driver input current Id1in of 240 microamperes (the collector current IcQ1 of 200 microamperes plus the base current IbQ3 of 40 microamperes) to produce the output current Iout of 2000 microamperes. The logic switching circuit 220 includes first and second NPN transistors Q4, Q5 that are emitter-coupled to a first current source ICS1 having a reference current Iref of 200 microamperes. For an NPNbeta of 60, the second NPN transistor Q5 has an emitter current IeQ5 of 244 microamperes corresponding to a collector current IcQ5 of 240 microamperes and a base current IbQ5 of 4 microamperes, when conducting. The first current source ICS1 accepts 200 microamperes of the emitter current IeQ5. The remaining 344 microamperes of the emitter current IeQ5 is accepted by the balancing circuit 215 as a current gain compensation signal Icgcs.

The balancing circuit 215 employs the sensing subcircuit 216 to provide a correction signal Icor indicating a first current gain characteristic (e.g., a lower PNPbeta for the PNP transistors) of the first driver 205. The balancing circuit 215 also employs the compensation subcircuit 217 to generate the current gain compensation signal Icgcs for the first driver 205 to substantially match a second current gain characteristic (e.g., a higher NPNbeta for the NPN transistors) of the second driver 210 based on the correction signal Icor.

The sensing subcircuit 216 includes fourth and fifth PNP transistors Q1A, Q3A, a first N-channel MOSFET transistor Q1B, fourth, fifth and sixth resistors R4, R5, R6, a second current source ICS2 having a reference current Iref2 of 200 microamperes and a first CMOS current multiplier ICM1 having an output current to input current multiplier of M plus one, which has a value of 11 in this example (i.e., the output current equals eleven times the input current). The compensation subcircuit 217 includes a second N-channel MOSFET transistor Q3B and a second CMOS current multiplier ICM2 having an output current to input current multiplier of unity (i.e., the output current equals the input current). The first N-channel MOSFET transistor Q1B and the second N-channel MOSFET transistor Q3B operate as diode-connected transistors in their respective subcircuits.

In the illustrated embodiment, the first and second CMOS current multipliers ICM1, ICM2 are Widlar-type NPN current repeaters that provide an in-phase current multiplication and isolation between their input and output currents. The multiplication factor may be selected and depends on a selection of specific circuit parameters. Both the input and output terminals of the first and second CMOS current multipliers ICM1, ICM2 operate as current sources thereby providing a high impedance to their respective interconnecting external circuits.

A PNPbeta of the fourth PNP transistor Q1A of about 10 is selected to essentially match the PNPbeta of the first PNP transistor Q1 within the acceptable tolerance range of about 5 percent, in this embodiment. The second current source ICS2 employing the reference current Iref2 of 200 microamperes produces a fourth PNP transistor Q1A collector current IcQ1A of 200 microamperes, since the gate current of the first N-channel MOSFET transistor Q1B is negligibly small. This collector current produces a base current IbQ1A of 20 microamperes resulting in an emitter current IeQ1A of 220 microamperes associated with the fourth PNP transistor Q1A.

The sixth resistor R6 is selected to have a value that is [M+1] times (eleven times, in the current example) the value of the third resistor R3 thereby yielding a resistor current IR6 of 220/11 or 20 microamperes associated with the sixth resistor R6. This current, when combined with the base current IbQ1A of 20 microamperes, provides an input current Icm1in of 40 microamperes to the first CMOS current multiplier ICM1. The first CMOS current multiplier ICM1 then provides a corresponding output current Icm1out of 440 microamperes, which is also a collector current IcQ3A for the fifth PNP transistor Q3A. This collector current IcQ3A leads to a base current IbQ3A of 44 microamperes and a corresponding emitter current IeQ3A of 484 microamperes for the fifth PNP transistor Q3A.

The base current IbQ3A of 44 microamperes represents the correction signal Icor, which is an output from the sensing subcircuit 216 and an input to the compensation subcircuit 217. The correction signal Icor of 44 microamperes is supplied to the input of the second CMOS current repeater ICM2 through the second N-channel MOSFET transistor Q3B thereby generating an output current of 44 microamperes for the second CMOS current repeater ICM2. This is the value of the current gain compensation signal Icgcs that compensates for the PNPbeta of 10 and allows the first driver 205 to provide the output current Iout of 2000 microamperes, in the current example. Of course, some variation of the parameters presented in the example of the current embodiment may be allowable as long as the output current Iout achieved by the first and second drivers 205, 210 are within the acceptable tolerance level.

In summary, an embodiment of the current invention employing a balancing circuit having a sensing subcircuit and a compensation subcircuit has been demonstrated. The balancing circuit provides the ability to deliver a correction signal related to a first current gain characteristic of a first driver and subsequently generate a current gain compensation signal. The current gain compensation signal allows the first driver to provide substantially the same output current that is provided by a second driver having a significantly greater second current gain characteristic, while employing a uniform driver control signal.

Although the present invention has been described in detail, those skilled in the art should understand that they can make various changes, substitutions and alterations herein without departing from the spirit and scope of the invention in its broadest form.

What is claimed is:

1. For use with a circuit having first and second complementary drivers exhibiting different current gain characteristics, said first driver having a plurality of vertical PNP transistors, a balancing circuit, comprising:
   a sensing subcircuit configured to provide a correction signal indicating a first current gain characteristic of said first driver; and
   a compensation subcircuit configured to generate a current gain compensation signal to said first driver to substantially match a second current gain characteristic of said second driver based on said correction signal.

2. For use with a circuit having first and second complementary drivers exhibiting different current gain characteristics, said second driver having a plurality of vertical NPN transistors, a balancing circuit, comprising:
   a sensing subcircuit configured provide a correction signal indicating a first current gain characteristic of said first driver; and
   a compensation subcircuit configured to generate a current gain compensation signal to said first driver to substantially match a second current gain characteristic of said second driver based on said correction signal.

3. The balancing circuit as recited in claim 1 wherein said sensing subcircuit comprises at least one diode-connected transistor configured to substantially replicate said current gain characteristic of said first driver.

4. The balancing circuit as recited in claim 1 wherein said compensation subcircuit comprises a current repeater.

5. For use with a circuit having first and second complementary drivers exhibiting different current gain characteristics, a balancing circuit, comprising:

a sensing subcircuit configured to provide a correction signal indicating a first current, gain characteristic of said first driver; and a compensation subcircuit having emitter coupled logic configured to generate a current gain compensation signal to said first driver to substantially match a second current gain characteristic of said second driver based on said correction signal.

6. For use with a circuit having first and second complementary drivers exhibiting different current gain characteristics, a balancing circuit, comprising:

a sensing subcircuit configured to provide a correction signal indicating a first current gain characteristic of said first driver; and a compensation subcircuit configured to generate a current gain compensation signal to said first driver to substantially match a second current gain characteristic of said second driver based on said correction signal, wherein said first and second current gain characteristics comprise a ratio of collector-to-base current of devices associated with said first and second drivers.

7. For use with a circuit having first and second complementary drivers exhibiting different current gain characteristics, said first driver having a plurality of vertical PNP transistors, a method of operating a balancing circuit, comprising:

providing a correction signal indicating a first current gain characteristic of said first driver; and generating a current gain compensation signal to said first driver to substantially match a second current gain characteristic of said second driver based on said correction signal.

8. For use with a circuit having first and second complementary drivers exhibiting different current gain characteristics, said second driver having a plurality of vertical NPN transistors, a method of operating a balancing circuit, comprising:

providing a correction signal indicating a first current gain characteristic of said first driver; and generating a current gain compensation signal to said first driver to substantially match a second current gain characteristic of said second driver based on said correction signal.

9. The method as recited in claim 7, wherein said providing is performed by a sensing subcircuit including at least one diode-connected transistor that substantially replicates said current gain characteristic of said first driver.

10. The method as recited in claim 7, wherein said generating is performed by a compensation subcircuit including a current repeater.

11. For use with a circuit having first and second complementary drivers exhibiting different current gain characteristics, a method of operating a balancing circuit, comprising:

providing a correction signal indicating a first current gain characteristic of said first driver; and generating by a compensation subcircuit including emitter coupled logic a current gain compensation signal to said first driver to substantially match a second current gain characteristic of said second driver based on said correction signal.

12. For use with a circuit having first and second complementary drivers exhibiting different current gain characteristics, a method of operating a balancing circuit, comprising:

providing a correction signal indicating a first current gain characteristic of said first driver; and generating a current gain compensation signal to said first driver to substantially match a second current gain characteristic of said second driver based on said correction signal, wherein said first and second current gain characteristics comprise a ratio of collector-to-base current of devices associated with said first and second drivers.

13. A phase locked loop (PLL) circuit, comprising:

a voltage controlled oscillator, coupled to a filter circuit, that receives a signal associated with a charging signal and provides an output signal having an output frequency;

a comparator circuit that provides a comparison signal proportional to a phase difference between said output signal having said output frequency and an input reference signal having an input frequency; and a charge pump that provides said charging signal via first and second complementary drivers exhibiting different current gain characteristics, said charge pump employing a balancing circuit, including:

a sensing subcircuit that provides a correction signal indicating a first current gain characteristic of said first driver, said first driver having a plurality of vertical PNP transistors; and a compensation subcircuit that generates a current gain compensation signal to said first driver to substantially match a second current gain characteristic of said second driver based on said correction signal.

14. A phase locked loop (PLL) circuit, comprising:

a voltage controlled oscillator, coupled to a filter circuit, that receives a signal associated with a charging signal and provides an output signal having an output frequency;

a comparator circuit that provides a comparison signal proportional to a phase difference between said output signal having said output frequency and an input reference signal having an input frequency; and a charge pump that provides said charging signal via first and second complementary drivers exhibiting different current gain characteristics, said charge pump employing a balancing circuit, including:

a sensing subcircuit that provides a correction signal indicating a first current gain characteristic of said first driver; and a compensation subcircuit that generates a current gain compensation signal to said first driver to substantially match a second current gain characteristic of said second driver based on said correction signal, said second driver having a plurality of vertical NPN transistors.

15. The PLL circuit as recited in claim 13 wherein said sensing subcircuit comprises at least one diode-connected transistor that substantially replicates said current gain characteristic of said first driver.

16. The PLL circuit as recited in claim 13, wherein said compensation subcircuit comprises a current repeater.

17. A phase locked loop (PLL) circuit, comprising:

a voltage controlled oscillator, coupled to a filter circuit, that receives a signal associated with a charging signal and provides an output signal having an output frequency;

a comparator circuit that provides a comparison signal proportional to a phase difference between said output signal having said output frequency and an input reference signal having an input frequency; and a charge pump that provides said charging signal via first and second complementary drivers exhibiting different current gain characteristics, said charge pump employing a balancing circuit, including:

a sensing subcircuit that provides a correction signal indicating a first current gain characteristic of said first driver; and a compensation subcircuit having emitter coupled logic that generates a current gain compensation signal to said first driver to substantially match a second current gain characteristic of said second driver based on said correction signal.

18. A phase locked loop (PLL) circuit, comprising:

a voltage controlled oscillator, coupled to a filter circuit, that receives a signal associated with a charging signal and provides an output signal having an output frequency;

a comparator circuit that provides a comparison signal proportional to a phase difference between said output signal having said output frequency and an input reference signal having an input frequency; and a charge pump that provides said charging signal via first and second complementary drivers exhibiting different current gain characteristics, said charge pump employing a balancing circuit, including:

a sensing subcircuit that provides a correction signal indicating a first current gain characteristic of said first driver; and a compensation subcircuit that generates a current gain compensation signal to said first driver to substantially match a second current gain characteristic of said second driver based on said correction signal, wherein said first and second current gain characteristics comprise a ratio of collector-to-base current of devices associated with said first and second drivers.

19. The balancing circuit as recited in claim 2 wherein said sensing subcircuit comprises at least one diode-connected transistor configured to substantially replicate said current gain characteristic of said first driver.

20. The balancing circuit as recited in claim 2 wherein said compensation subcircuit comprises a current repeater.

21. The method as recited in claim 8 wherein said providing is performed by a sensing subcircuit including at least one diode-connected transistor that substantially replicates said current gain characteristic of said first driver.

22. The method as recited in claim 8 wherein said generating is performed by a compensation subcircuit including a current repeater.

23. The PLL circuit as recited in claim 14 wherein said sensing subcircuit comprises at least one diode-connected transistor that substantially replicates said current gain characteristic of said first driver.

24. The PLL circuit as recited in claim 14 wherein said compensation subcircuit comprises a current repeater.

* * * * *